(12) United States Patent
Shteynberg et al.

(10) Patent No.: US 6,529,354 B1
(45) Date of Patent: Mar. 4, 2003

(54) POWER-UP AND NO-LOAD/LIGHT LOAD PROTECTIVE MECHANISMS FOR DC:DC CONVERTERS

(75) Inventors: Anatoly Shteynberg, San Jose, CA (US); Dimitry Goder, San Jose, CA (US)

(73) Assignee: Switch Power, Inc., Campbell, CA (US)

( * ) Notice: Subject to any disclaimer, the term of this patent is extended or adjusted under 35 U.S.C. 154(b) by 0 days.

(21) Appl. No.: 09/517,941

(22) Filed: Mar. 3, 2000

(51) Int. Cl.[7] ................................................ H02H 7/00
(52) U.S. Cl. .............................. 361/18; 361/58; 361/90
(58) Field of Search ............................ 361/18, 90, 100, 361/58

(56) References Cited

U.S. PATENT DOCUMENTS 4,903,182 A * 2/1990 Pilukaitis et al. ........... 323/289
5,087,871 A * 2/1992 Losel .......................... 323/299

* cited by examiner

Primary Examiner—Stephen W. Jackson
(74) Attorney, Agent, or Firm—Dorsey & Whitney LLP (57) ABSTRACT

Switching circuits including DC:DC converters of various topologies are provided with a soft-start mechanism that ensures safe start-up operation. The mechanism causes the converter switches to be driven such that on-impedance is increased during at least a portion of the time the switches are turned on. Increased on-impedance condition is invoked during power-up, and/or no-load or light-load condition. The increased on-impedance temporarily reduces output voltage and/or drive current provided by the converter.

16 Claims, 6 Drawing Sheets

POWER-UP AND NO-LOAD/LIGHT LOAD PROTECTIVE MECHANISMS FOR DC:DC CONVERTERS

FIELD OF THE INVENTION

The present invention relates generally to DC:DC power converters, and more specifically to mechanisms for ensuring a non-destructive start at power-up, under no-load or light load conditions, and under overload conditions.

BACKGROUND OF THE INVENTION

Circuitry to implement DC:DC converters is known in the art. Such circuits receive an input-side DC voltage that is coupled to a input voltage (Vin) via a switching circuit that has a low on impedance and a high off impedance. The result is that Vin is sampled or chopped and transformer-coupled to an output side. On the output side, the transformer-coupled waveform is rectified and filtered to provide a regulated output voltage Vo that may be greater than or less than the input voltage Vin. Feedback from output to input can be used to regulate the sampling duty cycle or frequency to provide an acceptably efficient DC:DC converter in a small form factor.

Figure 1A:
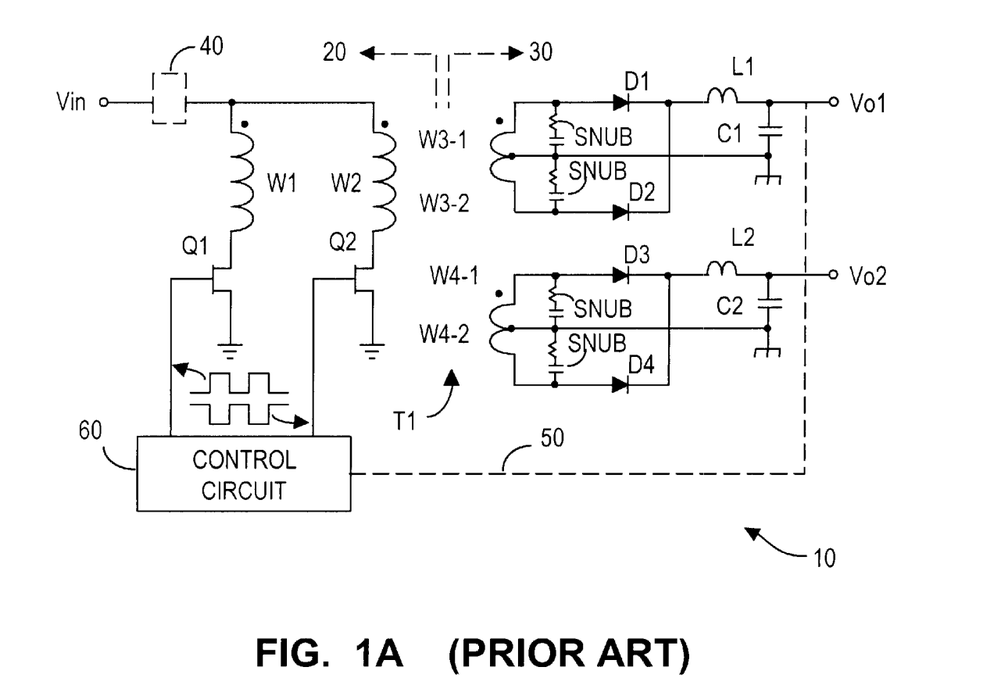
FIG. 1A depicts an exemplary prior art isolated topology DC:DC converter with which the present invention may be practiced.

The present invention may be used with many circuits that electronically sample an input voltage with a switch such that the magnitude of an output voltage can be varied by the parameters of the switch. Such circuits can encompass DC:DC converter topologies including push-pull, and feed forward among others. By way of example, FIG. 1A depicts a so-called voltage-fed push-pull DC:DC converter 10, according to the prior art, as having an input or primary side 20 and an output or secondary side 30. The input and output sides are essentially demarcated by transformer T1, which has input side or primary windings W1, W2, and output side or secondary windings W3-1,W3-2 and W4-1,W4-2. In some applications, windings W1 and W2 are identical, and center tapped windings W3-1,W3-2,W4-1,W4-2 are identical. However, in general the various sets of windings may differ from each other. Because transformer T1 isolate the input side and the side, transformer-coupled topologies such as shown in FIG. 1A are sometimes referred to as isolated DC:DC converters.

The input side 20 of the converter is coupled to a source of DC potential Vin that in some applications may be pre-regulated with a pre-regulator 40 whose output potential is controlled within a known tolerance. In other applications, pre-regulation is omitted and feedback 50 is used to modulate pulse width of drive signals output from a control circuit 60, to regulate the output voltage(s), shown here as V01, V02.

In FIG. 1A, input voltage, which may be the output potential from pre-regulator 30, is sampled or chopped using push-pull switching transistors Q1, Q2 and respective transformer T1 primary windings W1, W2. Control circuit 50 provides complementary drive signals to the input leads of Q1, Q2 such that when Q1 is on, Q2 is off, and vice versa. Although Q1 and Q2 are shown as switching an end of primary windings W1, W2 to ground potential, it is understood that ground potential implies a stable potential. Stated differently, if desired a potential other than 0 V DC might instead be switchably coupled to an end of primary windings W1 and W2. This understanding that ground is simply a convenient reference potential shall apply throughout this disclosure.

On the converter output side 30, center-tapped secondaries W3-1, W3-2, and W4-1, W4-2 of transformer T1 step-up or step-down the chopped waveforms, which are rectified by diodes D1, D2 and inductor L1-capacitor C1, and by diodes D3, D4 and inductor L2-capacitor C2. As described below, in an attempt to reduce voltage stress on the output side rectifier components and to reduce EMI it is customary to insert snubbers, typically a series-coupled resistor-capacitor, across each output winding of T1.

Feedback loop 50 can sample the DC output voltages, here shown as Vo1, Vo2, to control the pulse width (or duty cycle) and/or frequency of the Q1, Q2 drive signals generated by control circuit 60. The secondary windings may output different magnitudes Vo1, Vo2 and the number of windings may be greater or less than two.

It can be difficult to ensure that system 10 (and DC:DC converter topologies other than voltage fed push-pull) operates in a safe mode initially upon start-up or power-on. For example, until output capacitors C1 or C2 become charged, the voltage output Vo1, Vo2 sensed by feedback loop 50 can remain close to zero. Control circuit 60 may falsely interpret this feedback information as commanding more output voltage, e.g., there should be an increase in duty cycle, frequency, and/or amplitude of the drive signals to switches Q1 and Q2.

But until C1 and C2 begin to charge-up, it is normal that the reported output voltage immediately upon start-up will be close to zero. Yet unless feedback loop 50 and/or control circuit 60 can distinguish the start-up under-voltage for Vo1, Vo2 from a steady-state decrease in magnitude of Vo1, Vo2 excessive inrush currents may be caused to flow through Q1 and Q2, perhaps with destructive results.

Various techniques seeking to ensure a safe or soft start-up have been attempted in the art. For example, for a time immediately following power-up, control circuit 60 can impose a pulse-width modulation upon the drive signals to Q1, Q2 to limit the maximum initial current that is allowed to flow through these switches. Control circuit 60 can then increase duty cycle from a guaranteed safe minimum initial start-up duty cycle to a normal operating duty cycle. In some applications, fairly complex circuitry may be required to ensure a safe soft start-up for a DC:DC converter.

Another problem associated with the circuitry of FIG. 1A occurs under no-load or light load condition, e.g., when neither Vo1 nor Vo2 is coupled to a sufficiently low load (not shown). Under such no-load or light-load conditions, an unregulated DC:DC converter can attempt to develop excessive output voltages Vo1, Vo2. Such over-voltage condition is not desirable and can unduly stress various components comprising system 10. Further, when a suitable load is ultimately seen at Vo1, Vo2, the previous high over-voltage condition may contribute to excessive overshoot on the output waveforms, with possible damage to the load(s) and/or system 10.

Figure 1B:
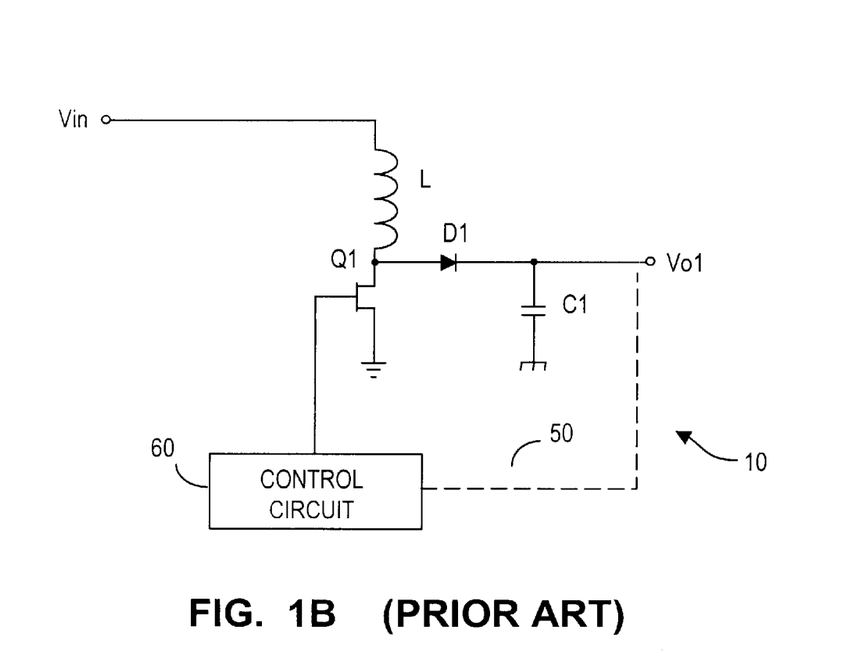
FIGS. 1B and 1C depict exemplary prior art non-isolated topology DC:DC converters, with which the present invention may be practiced.
Figure 1C:
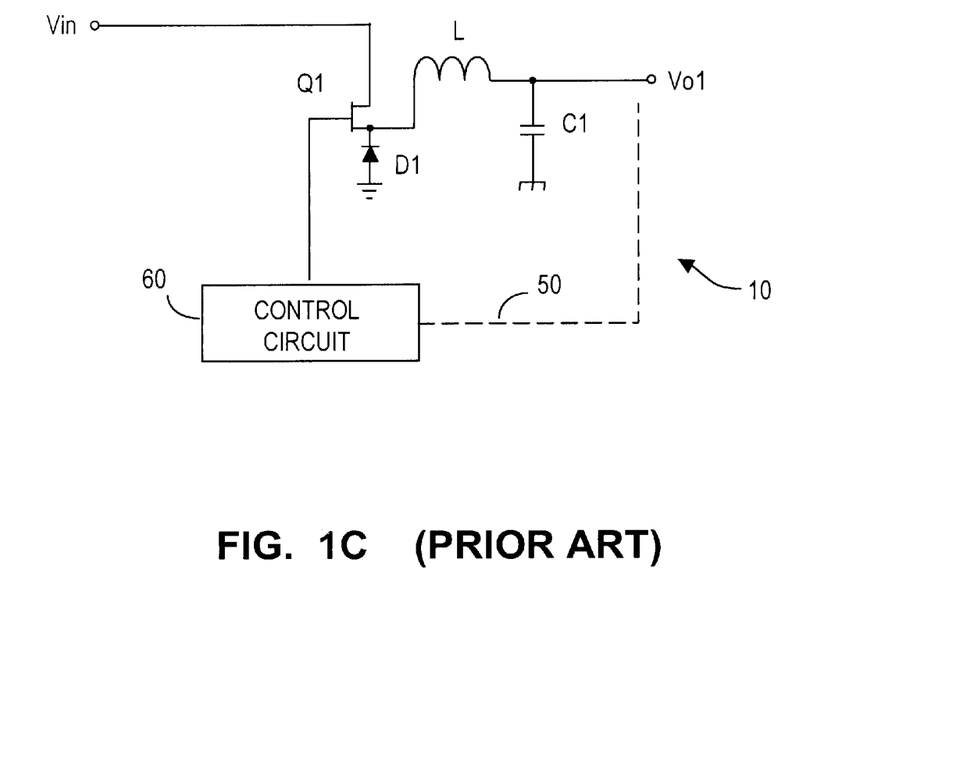

FIGS. 1B and 1C depict two non-isolating DC:DC converter topologies. In FIG. 1B, switch Q1 is switched on and off digitally by an output signal from control circuit 60. The result produces a chopped or sampled version of Vin at the junction of inductor L and switch Q1. This chopped signal is rectified, e.g., by diode D1 and capacitor C1, to produce a DC output signal Vo1. The Vo1 signal may be fed-back to control circuit 60, which will then alter at least one parameter of the drive signal to Q1 to try to maintain a desired level of Vo1.

Another non-isolated DC:DC converter topology is shown in FIG. 1C. Again, Q1 is switched on and off digitally by an output signal from control circuit 60, and as a result, a sampled fraction of Vin is coupled to inductor L. The resultant sampled or chopped signal is rectified, here by inductor L and capacitor C1. The rectified output voltage Vo1 may be fedback to control circuit 60, which will then attempt to regulate Vo1 by controlling a parameter of the drive signal to switch Q1.

In the configurations shown in FIGS. 1A–1C, switch Q1 (and if present, Q2) may be called upon to conduct excessive current during start-up or power-up to the DC:DC converter circuit. Thus, there is a need for a soft-start mechanism for use with input voltage-sampled circuits, including DC:DC converters of various topologies, both isolating and non-isolating. It should be possible to implement such mechanism reliably without adding undue complexity to the system design. Further, a simple mechanism should be provided to safely limit output voltage developed by such circuits including DC:DC converters under no-load or light-load conditions. Preferably such mechanisms should be compatible such that a DC:DC converter can be provided with both a soft-start start-up mechanism and with no-load/light-load over-voltage protection mechanism.

The present invention provides such mechanisms for use with switching circuits and more particularly with DC:DC converters of essentially any topology.

SUMMARY OF THE INVENTION

In a first aspect, the present invention provides a sampled input voltage circuit such as a DC:DC converter with a soft-start mechanism that ensures a safe start-up. The DC:DC converter may have isolating or non-isolating topology, and may be push-pull or non-symmetrical.

In an isolating topology, the DC:DC converter includes at least one switch (Q1, Q2) coupled via a converter transformer (T1) primary winding (W1, W2) to a source of operating input potential (Vin). In a non-isolating topology, the DC:DC converter typically includes a single switch Q1 and an inductor L that is switchingly coupled to a source of operating input potential (Vin).

The present invention recognizes that at least one parameter of the converter output voltage (Vo) may be controlled by varying magnitude of the on-impedance of switch Q1 or switches Q1, Q2 during at least part of the time the switch is on. More specifically, during start-up of DC:DC converters, the on-impedance of Q1, Q2 is intentionally increased to limit a parameter of Vo, e.g., magnitude, until steady-state condition is attained. Once steady-state is reached, the present invention permits the on-impedance of Q1, Q2 to be reduced to a lowest magnitude, which contributes to steady-state operating efficiency of the DC:DC converter. In such mode of operation, the Q1, Q2 drive signals may be referred to as linear mode signals rather than pure digital signals since Q1 and Q2 are permitted to operate in a linear rather than digital mode during start-up and, if necessary, during overload condition.

In one embodiment a time-lag voltage regulator is coupled between the source of input voltage Vin and the driver to the switch device Q1, or devices Q1, Q2. An exemplary time-lag voltage regulator can simply include a series-coupled resistor Rd and capacitor Cd connected between Vin and ground, in which the Rd-Cd node is sampled to provide operating voltage to the driver for the switch devices. At power-on, the Q1, Q2 driver circuit will not receive sufficient operating potential to drive Q1, Q2 in digital mode until a lag time, determined by the Rd-Cd time-constant, passes. After the lag time passes, sufficient voltage is presented to the Q1, Q2 driver circuit to ensure steady-state digital operation (e.g., full-on, full-off) of Q1, Q2.

A second embodiment can also be used with isolating topology DC:DC converters, push-pull or otherwise, or with non-isolating topologies. In this embodiment, the current through switch Q1 or Q1 and Q2 is sampled to obtain a measure of primary drive current and indeed secondary or output drive current. Such current measurement may be made by coupling a sampling resistor Rs0 is in series with the drive device(s) Q1, Q2, for example between the common node or leads of Q1, Q2 and ground (or other reference node).

The primary drive current i0 carried by Q1, Q2 is sampled and compared to a Vref reference voltage, where Vref represents a safe magnitude of i0. The present invention provides an error amplifier whose input potentials are i0·Rs0 and Vref, and whose output is coupled to the input of a voltage regulator. The voltage regulator output controls the maximum output amplitude or amplitude envelope available from the Q1, Q2 driver, whose outputs are Vg1, Vg2 drive signals. At power-up to the DC:DC converter, the voltage regulator output will have an envelope that begins at substantially zero potential and increases to a maximum envelope potential, perhaps approaching Vin. As a result, the envelope associated with Vg1, Vg2 drive signals will initially be small, but can increase in magnitude. If the voltage given by i0·Rs>Vref, the present invention modulates the input drive signal amplitudes Vg1, Vg2 to Q1, Q2 with an envelope that somewhat linearly approaches full-drive during power-up, to reduce input current. During no-load or light-conditions, Vg1 and Vg2 are amplitude modulated such that Q1 and Q2 intentionally drop potential across their respective Rds impedances. Thus, only a fraction (rather than essentially all) of the Vin potential is dropped across the T1, T2 primaries, which reduces the magnitude of Vo1, Vo2 until no-load or light-load condition ceases.

As long as i0·Rs>Vref, the voltage regulator cause less than full amplitude Vg1, Vg2 drive signals to be output by the Q1, Q2 driver. Thus, rather than couple all of Vin across the T1, T2 primaries (e.g., in an isolating topology), or across inductor L (e.g., in a non-isolating topology), a fraction of Vin is intentionally dropped across the linear Rds drain-source impedance of Q1 or Q2 and resistor Rs0. After power-up, Q1, Q2 are normally operated digitally, e.g., substantially full-on or full-off, with the result that the fraction of Vin dropped across Rds of Q1 or Q2 and Rs0 is negligibly small. Since the sampled current through Rs0 provides a measure of output load current, the present invention can also protect the DC:DC converter against overload condition.

The first and second aspects of the present invention may be used together, or may be used individually.

Other features and advantages of the invention will appear from the following description in which the preferred embodiments have been set forth in detail, in conjunction with the accompanying drawings.

DETAILED DESCRIPTION OF THE PREFERRED EMBODIMENTS

Figure 1D:
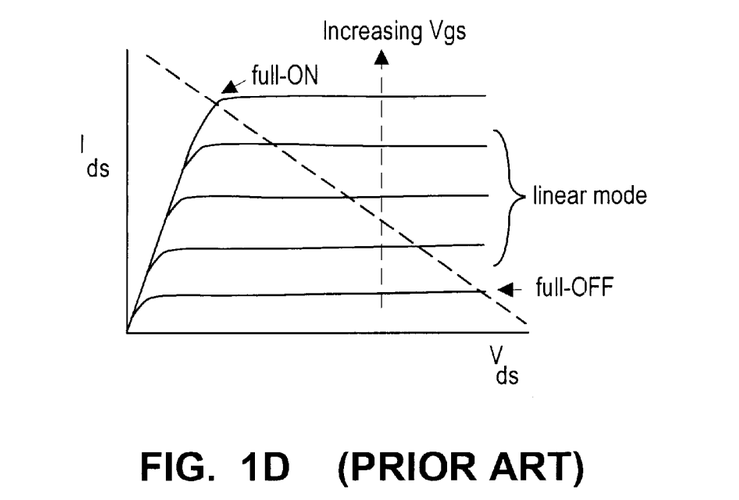
FIG. 1D depicts Ids vs. Vds characteristics as a function of Vgs for semiconductor MOS switches Q1, Q2, according to the prior art.

In an isolating DC:DC converter, the present invention recognizes that when Q1 and Q2 are semiconductor switches, e.g., MOS devices, it is not necessary to operate them strictly in a digital, fully-on, fully-off mode. In a non-isolating DC:DC converter configuration, the present invention recognizes that when Q1 is a semiconductor switch, e.g., a MOS device, it is not necessary to operate the switch strictly in a digital, fully-on, fully-off mode. FIG. 1D depicts the general characteristics of such switch devices, showing drain-source current (Ids) versus drain-source voltage (Vds) as a function of different gate-source bias potentials (Vgs). In prior art configurations such as FIG. 1A, Q1 and Q2 are operated digitally in that Vg1, Vg2 are switched between first and second gate-source voltages that turn Q1 or Q2 fully on or fully off. In prior art configurations such as FIGS. 1B and 1C, switch Q1 is operated digitally in that Vg1 is switched between first and second gate-source voltages that turn Q1 fully on or fully off.

As will now be described with respect to the exemplary isolating DC:DC converter configuration of FIG. 2A, during power-up of a DC:DC converter 100, the present invention, shown as drive circuit 110, increases the on-impedance of Q1, Q2 for at least a portion of the on-times for these switches. This is in contrast to the prior art configuration of FIG. 1A, in which Q1, Q2 are either fully-on or fully-off. In this somewhat simplified embodiment, the present invention is used to soft-start a DC:DC converter, shown here as having push-pull topology without output-to-input feedback. However, it is understood that other switching configurations may instead benefit from soft start-up protection and overload protection, according to the present invention. The present invention can safely limit start-up output voltage and/or current and/or sort-start time, with a variety of switching circuit configurations.

Figure 2A:
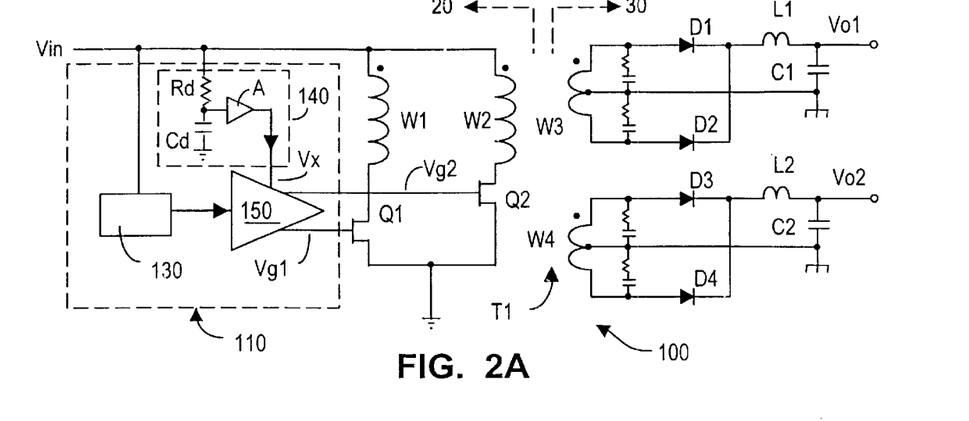
FIG. 2A depicts an R-C embodiment of a soft-current mechanism for an isolating DC:DC converter (here shown as an exemplary push-pull configuration) to promote safe start-up, according to the present invention.

In the simplified configuration of FIG. 2A, drive circuit 110 comprises a control circuit 130, a time-lag voltage regulator 140, and a preferably complementary push-pull driver 150 whose output(s) drive switches Q1, Q2. Q1 and Q2 are respectively coupled to a source of input voltage Vin via converter transformer T1 primary windings W1, W2. As Q1 and Q2 are turned on and off by circuit 110, a pulsating waveform is transformer coupled from the primary 20 side of the converter circuit to the secondary side 30, and is rectified and output as Vo1, Vo2.

In a conventionally driven configuration, Q1 and Q2 would at any given time be full-on or full-off, but would not intentionally be driven in an in-between state. For example, when Q1 is driven fully on essentially all of Vin is impressed across W1. The present invention recognizes that it can be advantageous during start-up to drive Q1 and Q2 partially on such that the fraction of Vin impressed across the primary transformer windings W1, W2 is a fraction (e.g., <1.0) of Vin. This decreased voltage across W1, W2 produces a lower primary current flow through W1, W2 with reduced output voltage at Vo1, Vo2. During start-up, a temporarily reduced magnitude of Vo1, Vo2 is in fact what is desired.

It is seen in FIG. 2A that time-lag voltage regulator 140 will output a voltage Vx that approaches Vin exponentially, but only after a time lag determined here by the magnitude of delay resistor Rd and delay capacitor Cd. The Rd-Cd time constant is selected such that the time lag tss it takes for Vx to reach a steady-state maximum Vmax that approaches Vin is a sufficiently long period of time to ensure that a safe power-up has been attained. A buffer amplifier A, for example a source follower, may be provided between the output voltage node of Rd-Cd and the voltage input node to driver 150.

The above description was directed to providing circuit protection against high current during start-up. Those skilled in the art will recognize that high current may also incur after start-up, for example as a result of an overload at the circuit output. It will be appreciated that the present invention is also useful in protecting against overload high current that occurs after start-up.

Figure 2B:
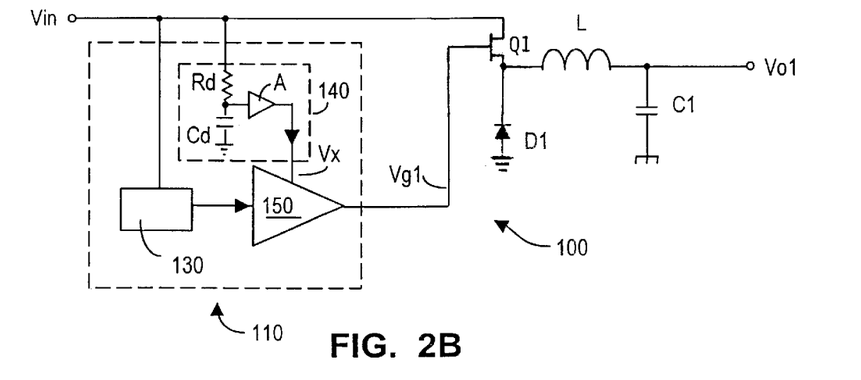
FIG. 2B depicts an R-C embodiment of a soft-current mechanism for a non-isolating DC:DC converter to promote safe start-up, according to the present invention.
Figure 2C:
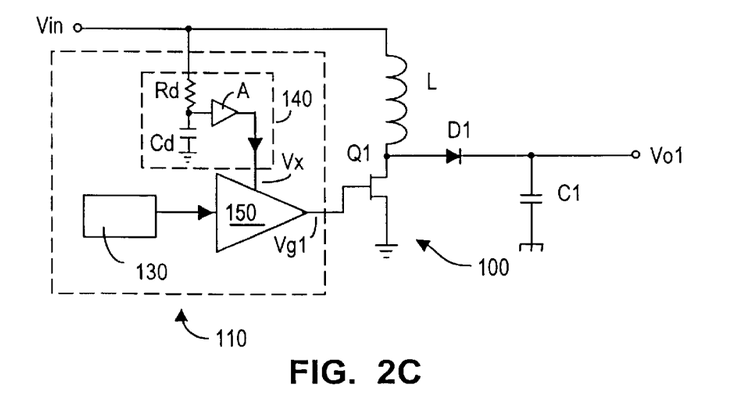
FIG. 2C depicts an R-C embodiment of a soft-current mechanism for a non-isolating DC:DC converter of a different topology than shown in FIG. 2B, to promote safe start-up, according to the present invention.

FIGS. 2B and 2C depict non-isolating DC:DC converter topologies that are provided with a time-lag voltage regulator 140, such as was described above with respect to the isolating topology of FIG. 2A. It will be appreciated that at power-up, the operating power coupled to system 100 will increase relatively rapidly from 0 V to Vin V. However the rate of increase in operating voltage seen by driver 150 will, of necessity, gradually increase from 0 V to approximately Vin, at an exponential rate determined essentially by the time lag constant Rd-Cd.

Figure 3A:
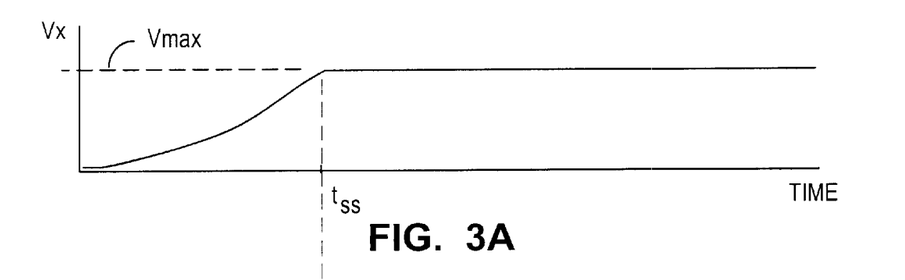
FIG. 3A depicts the Vx(t) node signal for the embodiment of FIG. 2A, according to the present invention.
Figure 3B:
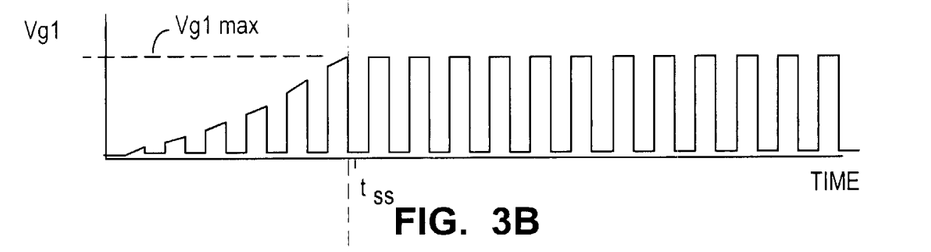
FIGS. 3B and 3C depict complementary amplitude-modulated Vg1(t), Vg2(t) switch drive signals, according to the present invention.
Figure 3C:
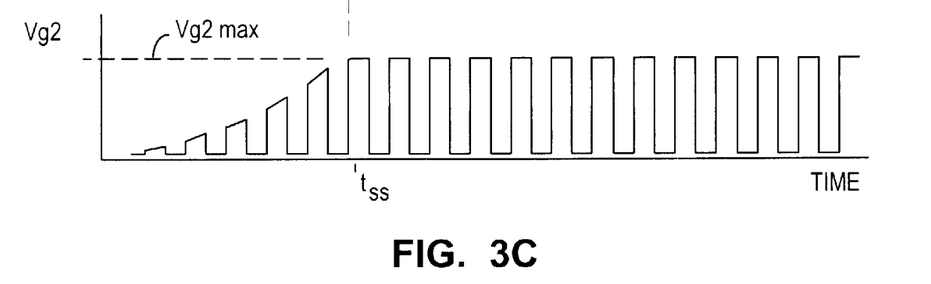

FIG. 3A depicts the exponentially rising waveform output by voltage-regulator 140 to driver 150 for the exemplary push-pull isolating topology shown in FIG. 2A. The rate of exponential increase in the rising waveform will be proportional to the Rd-Cd product time-constant. Driver circuit 150 outputs pulse-width modulated signals Vg1, Vg2 at a repetition rate that typically is fixed. However as shown by FIGS. 3B and 3C, the amplitude envelope on the chopped drive signals Vg1, Vg2 has a coefficient that starts out small, during beginning of power-up, and increases exponentially to a maximum value at a time when safe power-up condition may be assumed. The time required to assume safe power-up is used to select magnitudes for Rd and Cd.

In essence, amplitude modulating the envelope of Vg1, Vg1 limits the primary side drive current, thus protecting DC:DC converter 100 during power-up. The fundamental equation governing current available from lag capacitor Cd is given by:

$$i = Cd \cdot dV/dt$$

If the rate of voltage change dV/dt is too large, excess current i is demanded. In many applications the switching repetition rate of Q1, Q2 dictate that dt is small. The present invention nonetheless reduces the drive current by reducing magnitude of dV, namely by imposing a co-efficient, here an exponential coefficient. The resultant equation is then given by:

$$i = K \cdot Cd \cdot dV/dt$$

where K is a coefficient<1.

At time t>tss, Vo1, Vo2 parameters will typically be maximum, e.g., maximum voltage out, maximum output current. However for t<tss, at least one and preferably both of switch Q1, Q2 are driven such that their on-impedance is greater than the steady-state on-impedance that results when maximum amplitude Vg1, Vg2 drive may safely be applied (at t>tss). Thus for t<tss, the magnitude of Vo1, Vo2, and the maximum drive output currents available at the Vo1, Vo2 nodes will be intentionally reduced by the reduced Vg1, Vg2 drive signals. Understandably a negative aspect of the configuration shown is that for t<tss, Q1 and Q2 may dissipate substantially power in their on state, since the primary current through W1 or W2 is dropped across a larger switch impedance, e.g., drain-source impedance of Q1 or Q2. Fortunately tss is not so long in duration as to cause destruction of Q1, Q2 due to excess heat dissipation during t<tss. Alternatively, in some applications the present invention will best be used to protect low dissipation circuits.

Figure 4:
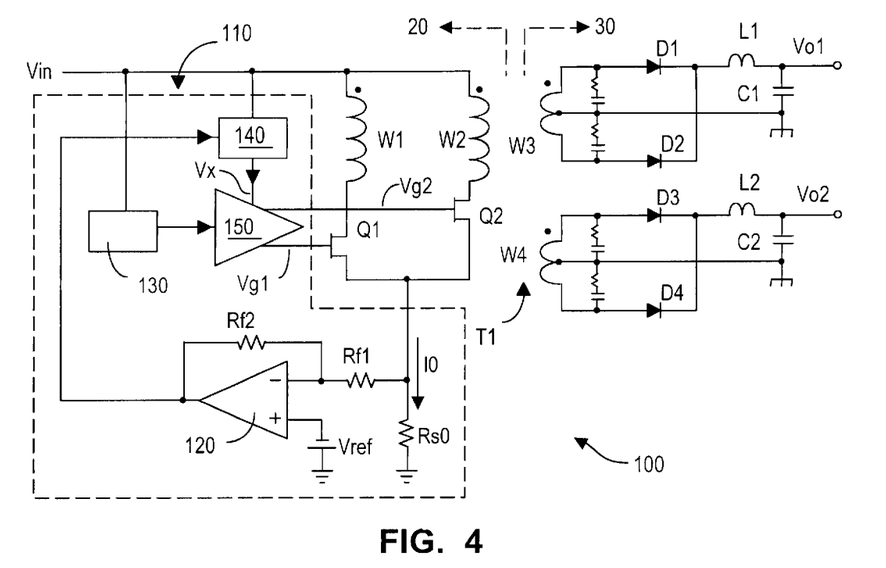
FIG. 4 depicts a preferred embodiment of a soft-current mechanism for a DC:DC converter (here shown as an exemplary push-pull configuration) to promote safe start-up, according to the present invention.

FIG. 4 depicts an alternative embodiment of the present invention. In this insulating embodiment, drive circuit 110 is operated in a linear mode to implement a soft-current start-up, and to implement an over-current linear mode drive. In FIG. 4, circuit 110 comprises an operational amplifier 120, a control circuit 130, a voltage regulator 140, and preferably complementary push-pull driver circuit 150.

A preferably small impedance current sampling resistor Rs0 is placed in series between the common node defined by the output nodes of switching devices Q1 and Q2, typically the tied-together source leads, and ground. The Io·Rs0 potential dropped across Rs0 provides a measure of primary-side drive current Is through Q1 and Q2. Operational amplifier 120 (or equivalent) compares this potential to a reference potential Vref, whose Vref magnitude may be selected to represent an upper limit for safe input side drive current. The comparison carried out by amplifier 120 results in an output error signal that is proportional to the difference between the two input signals. Feedback resistors Rf2, Rf1 are used to set the inverting gain of operational amplifier 120.

When i0Rs0<Vref, error amplifier 120 outputs a positive signal that is input to voltage regulator 140. On the other hand, when i0Rs0>Vref, the magnitude of the output of error amplifier 120 will decrease.

Figure 5A:
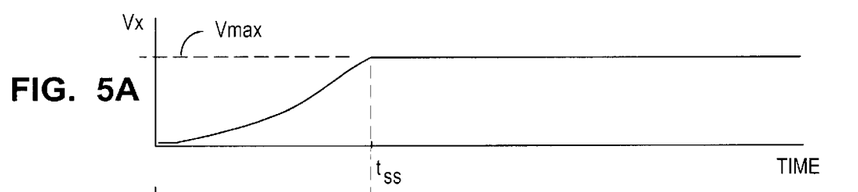
FIG. 5A depicts the Vx(t) node signal, according to the present invention.
Figure 5B:
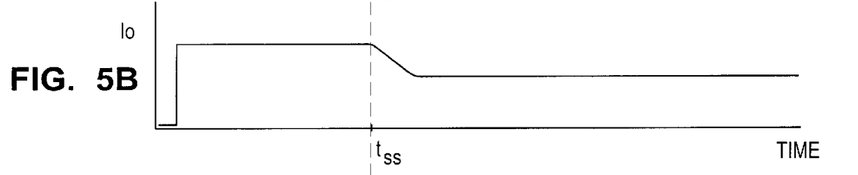
FIG. 5B depicts Is(t) primary current, according to the present invention.

Voltage regulator 140 outputs a DC envelope potential Vx that varies in amplitude as a function of the output of error amplifier 120. Referring to waveforms 5A and 5B, for the configuration of circuit 110 shown in FIG. 4, increasing i0 magnitude>Vref/Rs0 commands voltage regulator 140 to output an envelope potential that increases from a minimal value to a maximum value V max. As seen in FIG. 5A, Vx does not increase precisely linearly as a function of time due to non-linearities associated with Q1, Q2 FET or MOSFET transfer functions.

Maximum value V max is achieved under steady-state operating conditions at time t>tss, e.g., when start-up conditions have passed. The duration of tss typically will depend upon input impedance, output load current, output capacitance, and may be in the range of tens of milliseconds to perhaps hundreds of milliseconds.

Control circuit 130 may be similar to control circuit 60 in prior art FIG. 1A. Essentially control circuit 130 outputs a essentially constant amplitude pulse train that is input to complementary driver 150. However the changing potential Vx output by voltage regulator 140 is also input to driver 150 such that the amplitude of Vx modulates the envelope of the Vg1, Vg2 pulse train drive signals to Q1 and Q2.

Figure 5C:
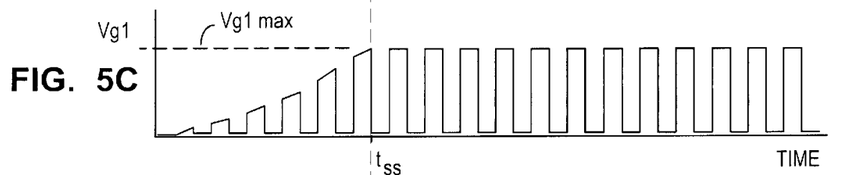
FIGS. 5C and 5D depict complementary amplitude-modulated Vg1(t), Vg2(t) switch drive signals, according to the present invention.
Figure 5D:
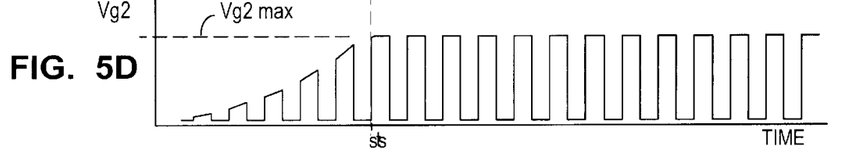

FIG. 5A depicts the gradually increasing magnitude of Vx, and may be somewhat similar in waveform shape to the exponentially increasing waveform shown in FIG. 3A for the configuration of FIG. 2. It will be the function of this gradually increasing waveform to impose a coefficient factor or envelope upon drive signals Vg1, Vg2 to switches Q1, Q2. FIG. 5B depicts magnitude of primary drive current $i_o$ as a function of time. FIGS. 5C and 5D depict the somewhat linearly increasing magnitude of Vg1, Vg2 (here, gate-source drive voltages) during start-up, e.g., from initial time to time tss. The maximum values of Vg1 and Vg2 represent digital operation of Q1 and Q2, e.g., gate-source drive signals that turn switch devices Q1, Q2 full on (e.g., minimum drain-source impedance Rds) or full off (e.g., maximum drain-source impedance Rds).

In a full-on condition, little or no potential is dropped across the drain-source impedance Rds associated with each device Q1, Q2, as the drain-source potential can be small and the fraction of input voltage Vin that is dropped across Q1 or Q2 is essentially nil.

However for t <tss, the less than maximum magnitudes of Vg1 and Vg2 cause Q1 and Q2 to be controlled and operated in a linear mode. As such, when t<tss, drain-source impedances Rds are intentionally made greater than when Q1 and Q2 are turned full-on. The higher Rds impedance means a greater fraction of input voltage Vin is dropped across Q1 or Q2, and thus slightly less voltage is available to be dropped across primary windings W1 or W2 of transformer T1.

As a result, the peak-peak potentials seen across secondary windings W3,W4 decrease in this active Q1, Q2 drive mode, with the result that Vo1 and Vo2 are reduced in magnitude. The overall effect is to ensure that the load current delivered by DC:DC converter 100 during power-up is limited to a safe magnitude. This magnitude may be controlled by selection of the magnitude of Vref and by the gain ratio Rf2/Rf1 for error amplifier 120. It is again emphasized that the push-pull DC:DC converter topology shown in FIG. 4 is exemplary, and the invention described with respect to system 110 is not limited to controlling only push-pull topologies. Further, modifications to system 110 are possible, including powering push-pull driver 150 from an R-C low pass filter, in which system 110 results in an R-C exponentially increasing voltage being applied to driver 150.

Figure 6:
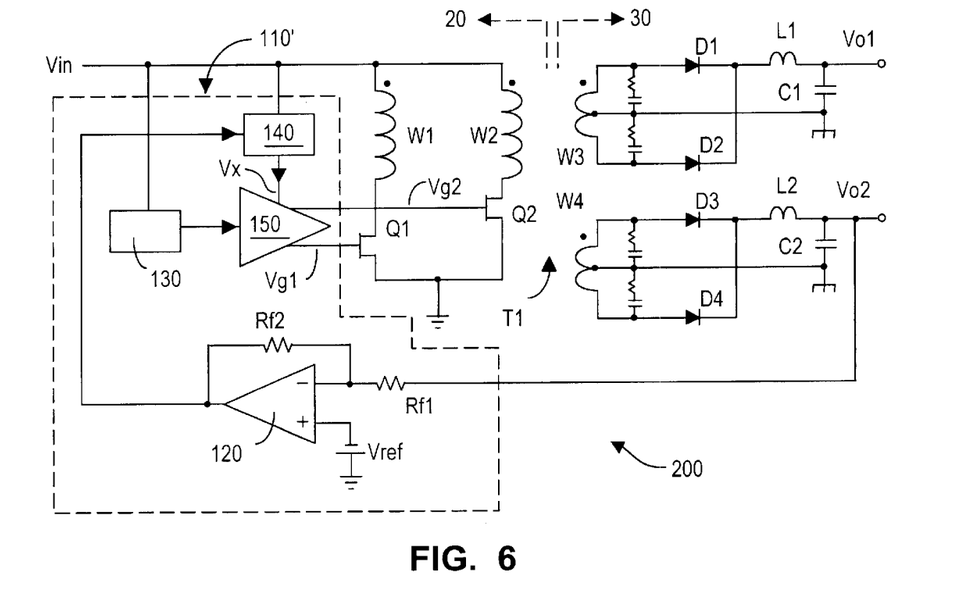
FIG. 6 depicts a preferred embodiment of a no-load, low-load mechanism for a DC:DC converter to promote safe operation under such load conditions, according to the present invention.

A second aspect of the present invention is shown in the embodiment of FIG. 6. In this embodiment, circuitry 110' (much of which may be similar to circuitry 110 described above) is used to monitor the output state of terminal Vo2 (normally outputting potential Vo2), and to protect DC:DC converter 200 against damage during no-load or light-load condition. For ease of illustration, DC:DC converter 200 is shown as a push-pull configuration, but it is to be understood that the present invention is not limited to use with push-pull topologies and may be used with other topologies as well.

A resistor Rf1 is coupled between the inverting input of operational amplifier 120 and an output voltage node, here Vo2, and a voltage reference Vref is coupled to the other, non-inverting, input of operational amplifier 120. The magnitude of Vref is selected to represent the threshold between a safe and unsafe output condition for node Vo2.

If the sampled potential at the inverting input of error amplifier 120 exceeds magnitude Vref, the operational amplifier output will decrease, but will increase if Vref exceeds the sampled potential.

As with circuit 110, the output magnitude of the operational amplifier may be coupled to a voltage regulator 140, whose output Vx is a changing amplitude voltage that will represent the amplitude envelope of drive signals Vg1, Vg2 for preferably MOS switches Q1, Q2. Control circuit 130 develops a pulse train that preferably is input to a complementary driver 150 whose output is Vg1, Vg2, amplitude-modulated by the magnitude of potential Vx.

Under no-load or too light-load conditions of node Vo2, the magnitude of the Vo2 voltage can increase, which increases the sampled potential presented to the inverting input of error amplifier 120. Typically when this potential exceeds Vref, an unsafe output condition is presumed to be present. However the decreasing operational amplifier output signal will act to reduce amplitude of Vg1, Vg2. This in turn causes Q1 and Q2 to operate in a linear rather than a digital mode, and a larger fraction of Vin will now be dropped across Q1, Q2 drain-source impedances Rds. As a result, less potential is effectively switched across transformer T1 primary windings W1,W2, and the peak-peak potential developed across secondary windings W3 and W4 will decrease. As a result, sampled output voltage Vo2 will decrease, as will Vo1. Even though a larger fraction of Vin is dropped across Rds in linear mode operation, under no-load or light-load conditions, the magnitude of increased power dissipation across Q1, Q2 is still relatively minimal.

However when the load presented to node Vo2 increases (or is coupled to node Vo2), Vo2 magnitude will decrease and decrease the sampled potential coupled to error amplifier 120. When Vref exceeds the sampled Vo2 potential, the increasing operational amplifier output will cause voltage regulator 140 to increase magnitude of envelope potential Vx to a maximum value. With maximum envelope Vx, Q1 and Q2 will now be driven with maximum voltage swing excursions for Vg1, Vg2 (e.g., as shown in FIGS. 3C and 3D, for time t>tss). In this fashion, DC:DC converter 200 may be protected against no load or too-light load condition.

Several aspects of the present invention have been described. A soft-start mechanism may be implemented with circuitry as simple as an Rd-Cd time-constant voltage regulator. The soft-current start-up input-side monitoring shown in FIG. 5, and the output-side monitoring shown in FIG. 6 to promote safe no-load or too light-load operation may be used separately or in combination within the same DC:DC converter. Further, as has been stated, the DC:DC converter topology with which either or both aspects of the invention may be used is not limited to the exemplary push-pull configuration that has been shown.

Figure 7:
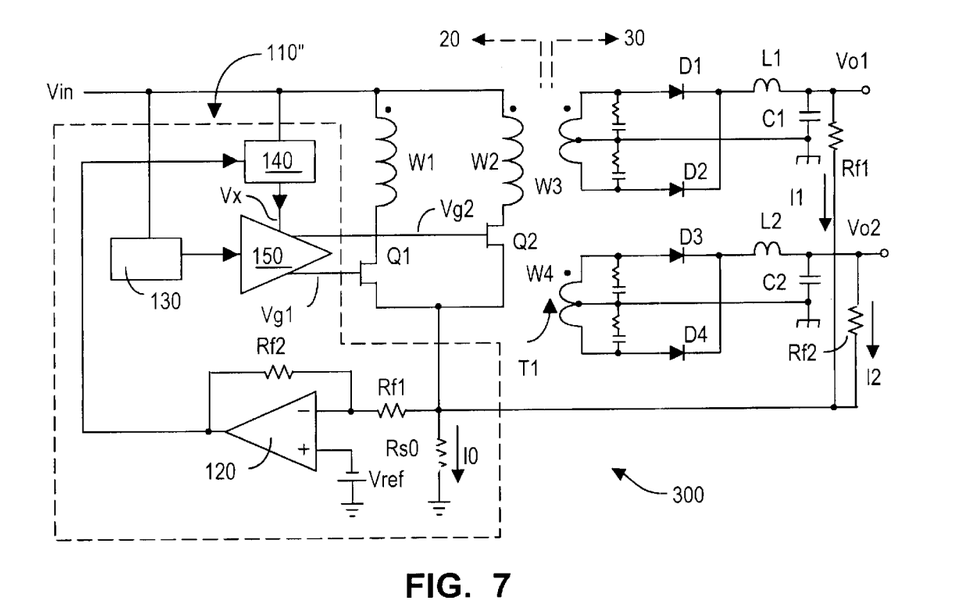
FIG. 7 depicts a DC:DC converter (here shown as an exemplary push-pull configuration) provided with a soft-start power-up mechanism and with a no-load/low-load mechanism, according to the present invention.

FIG. 7 depicts an embodiment that includes input-side monitoring to promote soft current start-up of DC:DC converter 300, as well as output-side monitoring of each secondary voltage Vo1, Vo2 to promote safe converter operation even during no-load or too light-load condition. Again, for ease of illustration, DC:DC converter is shown as being push-pull, but may be any other con figuration.

In FIG. 7, DC:DC converter 300 includes input-side and output-side protective circuit 110", which may be similar to circuit 110' or circuit 110, as described earlier herein. With respect to circuit 110", resistor Rs0 monitors input-side primary current i0 and thus influences the potential at the inverting input of operational amplifier 120. Also contributing to this inverting input potential are currents i1 and i2 sampled from potentials at output nodes Vo1, Vo2 respectively.

In a manner similar to what has been described with respect to FIGS. 4, 5A–5D, and FIG. 6, the error amplifier output controls the envelope output potential Vx from voltage regulator 140. The Vx potential amplitude-modulates the complementary push-pull signals provided by driver 150, responsive to control circuit 130 signals. The nature of the feedback paths provided is such that circuit 110" can provide soft-current correction during start-up or power-up of converter 300, and can also protect against over-voltage at output nodes Vo1, Vo2 resulting from the absence of loads or too light loading.

If desired, circuit 110" may include separate operational amplifiers 120 to provide greater leeway in scaling sensitivity of circuit 110" to detect changes in any of currents i0, i1, i2. Although the preferred embodiments have been described with respect to MOS switches Q1, Q2, the present invention may be implemented using other switching devices that may be operated in at least a linear mode.

Specific details of circuits 110, 100', 110" are not given as those skilled in the art will understand that control circuits, voltage regulators, and complementary driver circuits may be designed and implemented in many different ways. It is further understood that circuits 110, 110', and 110" may each be fabricated on a common standalone integrated circuit for use with an existing DC:DC converter. It is further understood that while the preferred embodiments have been described with respect to a DC:DC converter outputting positive potential, the present invention may also be used with converters outputting negative potential, or potential of both polarities. As noted, the present invention may be practiced with isolated or non-isolated DC:DC converter topologies.

To recapitulate, the present invention is useful to promote safe start-up operation in a switching circuit that has a switch coupled to an input power source via a converter transformer winding, or otherwise. The switch has an on impedance and an off impedance, and is driven by circuitry according to the present invention such that for at least a portion of the time the switch is on, its on impedance is intentionally made larger. This increase in switch on impedance (e.g., in Rds) alters at least one parameter of the output waveform obtained at the secondary (or output) side of the converter transformer, for example, maximum output voltage, maximum output current. In addition, the present invention can be used to dictate length of time tss that the protective circuitry affects the on impedance of the switch or switches. The result is that with relatively few additional components, safe start-up of switching circuits in general, and DC:DC converters in particular is promoted.

Modifications and variations may be made to the disclosed embodiments without departing from the subject and spirit of the invention as defined by the following claims.

What is claimed is:

1. For use with a switching circuit that receives an operating voltage Vin and outputs a signal Vo, said switching circuit defineable as having switch circuit-on times and switch circuit-off times but where magnitude of said Vo need not be controllable by a duty cycle ratio of said switch circuit-on times/switch circuit-off times, a method to control at least one parameter describing said signal Vo, comprising:

coupling a switch to said operating voltage Vin so as to conduct current through said switch as a function of impedance of said switch such that magnitude of said Vo is controlled by impedance of said switch; and said switch having a switch impedance that is varied continuously during circuit switch-on times between a low switch-on impedance and a higher switch-off impedance during at least one of Vo power-up for said switching circuit and low load coupled to said switching circuit.

2. The method of claim 1, wherein:

said switching circuit is part of a DC:DC converter that requires a time period tss to achieve steady-state; further including determining duration of said time period tss by monitoring at least one parameter associated with said signal Vo.

3. The method of claim 2, wherein:

said switching circuit is part of a DC:DC converter that requires a time period tss to achieve steady-state; and magnitude of said switch impedance is increased during time t<tss.

4. The method of claim 1, wherein:

said switching circuit is part of a DC:DC converter that requires a time period tss to achieve steady-state operation; and said switch is a solid state device coupled to receive a drive signal that during time t<tss is insufficent in magnitude to turn said switch completely on;

wherein said time period tss is determined by components defining a time constant of tss.

5. The method of claim 1, wherein:

said switching circuit is part of a DC:DC converter that requires a time period tss to achieve steady-state operation; and duration of said time period tss is determined by monitoring current through said switch.

6. The method of claim 1, wherein:

said switching circuit is part of a DC:DC converter that requires a time period tss to achieve steady-state operation; and duration of said time period tss is determined by monitoring current output by said DC:DC converter.

7. The method of claim 1, wherein:

said switching circuit is part of a DC:DC converter that requires a time period tss to achieve steady-state operation; and duration of said time period tss is determined by monitoring magnitude of said signal Vo.

8. The method of claim 1, wherein said circuit includes a DC:DC converter having at least one characteristic selected from a group consisting of (a) said DC:DC converter has an isolating topology, (b) said DC:DC converter has a non-isolating topology, and (c) said DC:DC converter has a push-pull topology.

9. A method of safely operating a DC:DC switching converter coupled between Vin operating potential and ground, and outputting at least one output signal Vo whose magnitude need not be controllable by varying switching duty cycle, the DC:DC converter having an inductor with a inductor node coupleable to said operating Vin potential, and having a semiconductor switch coupled to said inductor so as to conduct current responsive to a switch drive signal; the method comprising the following steps:

(A) detecting at least one DC:DC switching converter event selected from a group consisting of (i) start-up operation, (ii) no-load operation, and (iii) too-light load operation; and (B) during at least detection of an event detected at step (a), continuously varying impedance of said semiconductor switch during DC:DC switching converter on-times between a low switch-on impedance and a higher switch-off impedance;

wherein current conducted through said switch varies as a function of impedance of said switch so as to vary magnitude of said output signal Vo.

10. The method of claim 9, wherein:

said DC:DC switching converter requires a time period tss to achieve steady-state; further including duration of said time period tss is determined by monitoring at least one parameter associated with said output signal Vo.

11. The method of claim 9, wherein:

said DC:DC switching converter requires a time period tss to achieve steady-state; and magnitude of said semiconductor switch impedance is increased during time t<tss.

12. The method of claim 9, wherein:

said DC:DC switching converter requires a time period tss to achieve steady-state operation; and during time t<tss said solid state switch receives a drive signal insufficient in magnitude to turn said solid state switch completely on;

wherein said time period tss is determined by components defining a time constant of tss.

13. The method of claim 9, wherein:

said DC:DC switching converter requires a time period tss to achieve steady-state operation; and duration of said time period tss is determined by monitoring current through said solid state switch.

14. The method of claim 9, wherein:

said DC:DC switching converter requires a time period tss to achieve steady-state operation; and duration of said time period tss is determined by monitoring current output by said DC:DC switching converter.

15. The method of claim 9, wherein:

said DC:DC switching converter requires a time period tss to achieve steady-state operation; and duration of said time period tss is determined by monitoring magnitude of said output signal Vo.

16. The method of claim 9, wherein said DC:DC switching converter has at least one characteristic selected from a group consisting of (a) said DC:DC converter has an isolating topology, (b) said DC:DC converter has a non-isolating topology, and (c) said DC:DC converter has a push-pull topology.

* * * * *